US005781001A

United States Patent [19]

Takemoto

[11] Patent Number: 5,781,001

[45] Date of Patent: Jul. 14, 1998

[54] DISPLAY-DRIVING VOLTAGE GENERATING APPARATUS

[75] Inventor: Masato Takemoto, Ayama-gun, Japan

[73] Assignee: Sharp Kabushiki Kaisha, Osaka, Japan

[21] Appl. No.: 725,987

[22] Filed: Oct. 4, 1996

[30] Foreign Application Priority Data

Oct. 4, 1995 [JP] Japan .................................... 7-257926

[51] Int. Cl.[6] .............................. G05F 1/577; G05F 1/68; H03K 19/0175

[52] U.S. Cl. ........................... 323/267; 323/270; 327/333

[58] Field of Search .................................... 323/266, 267, 323/268, 906, 269, 270; 307/484, 485, 296; 327/333

[56] References Cited

U.S. PATENT DOCUMENTS

| | | | |
|---|---|---|---|
| Re. 35,043 | 9/1995 | Takeda | 323/906 |
| 4,158,786 | 6/1979 | Hirasawa | 307/296 |
| 5,589,790 | 12/1996 | Allen | 327/333 |

FOREIGN PATENT DOCUMENTS

| | | |
|---|---|---|
| 0 606763 | 7/1994 | European Pat. Off. . |
| 0 670568 | 9/1995 | European Pat. Off. . |
| 9 115126 | 3/1992 | Germany . |
| 3-230116 | 10/1991 | Japan . |
| 4-294325 | 10/1992 | Japan . |
| A 5-150736 | 6/1993 | Japan . |
| A 5-313612 | 11/1993 | Japan . |
| WO 9 621879 | 7/1996 | WIPO . |

OTHER PUBLICATIONS

"Hitachi LCD Driver LSI Data Book", Mar. 1990 Edition, pp. 61–62.

"1990 Sanyo Semiconductor Data Book, Industrial Equipment Integrated Circuits", vol. 4, Constant Voltage Edition, pp. 183–184.

*Primary Examiner*—Peter S. Wong
*Assistant Examiner*—Rajnikant B. Patel

[57] ABSTRACT

Power consumption, in an apparatus for generating a display unit drive voltage, is reduced. The potential at a point A is held substantially intermediately between V0 and V5 by a potential corrector 36. Voltage regulators 31, 32 supplied with V0 are connected through point A to voltage regulators 33, 34 supplied with voltage V5. Point A in turn is connected to a charger storing unit 35. The charge storing unit 35 stores the charge flowing into point A. Wasteful flow of electricity is thus eliminated for a reduction in power consumption.

20 Claims, 12 Drawing Sheets

DISPLAY-DRIVING VOLTAGE GENERATING APPARATUS

BACKGROUND OF THE INVENTION

1. Field of the Invention

The present invention relates to an apparatus for generating a voltage for driving a display unit such as a simple matrix type liquid crystal display panel.

2. Description of the Related Art

In conventional simple matrix type liquid crystal display units or MIM (Metal Insulator Metal) display units, time division drive and AC-converting drive are conducted with the use of six levels of voltages supplied to a drive circuit. These voltages are resistance-divided on the basis of a power supply having two types of voltages higher than a logic source voltage of a logic circuit used in a system constituting the display unit. As an alternative, the voltage divided is supplied to a liquid crystal drive circuit through an operational amplifier connected as an voltage follower. Typical conventional techniques are disclosed in detail in "Hitachi LCD Driver LSI Data Book", March 1990 edition, pp.61, 62, 286, published by Hitachi, Ltd. and in an explanation on LA5311M in "1990 Sanyo Semiconductor Data Book, Industrial Equipment Integrated Circuits Vol.4, Constant Voltage Edition", pp.183, 184, published by Sanyo Electric Co., Ltd.

FIG. 12 shows an electrical configuration of a 6-level drive voltage generating apparatus according to the prior art. Voltages V0, V5 required for driving the liquid crystal are applied from an external source through terminals V0in, V5in. Voltages V0, V5 are divided by resistors 1 to 5 called bleeder resistors to produce four types of voltage. The resistance-divided voltages are reduced in impedance by four operational amplifiers 11 to 14 connected as a voltage follower to produce voltages V1, V2, V3, V4. Six types of voltages including these voltages and V0, V5 applied from an external source are supplied to the liquid crystal display unit. The relative magnitude of the voltages is V0 >V1 >V2 >V3 >V4 >V5. There may be a case in which a voltage higher than the voltage V0 and a voltage lower than the voltage V5 are supplied to generate the voltages V0 and V5 by division with use of resistors. Such a case, however, will not be described, as the minimum basic configuration is as shown in FIG. 12.

Methods for reducing the power consumption of a liquid crystal apparatus using such operational amplifiers are disclosed in JP-A-5-313612 entitled "Liquid crystal apparatus and electronic equipment" as shown in FIG. 1 and in JP-A-5-150736 using a plurality of "impedance conversion circuits".

Whether a drive voltage is generated only by division using resistors or by adding a voltage follower with an operational amplifier is determined according to the number of drive lines based on the magnitude of the electrostatic capacity of the liquid crystal panel driven, the number of time-divided drives and the duty factor. In the case where the voltage is supplied only by dividing it with resistors, the display panel used is limited to a relatively small one, in which case a voltage follower is generally added. The operational amplifier used as a voltage follower is operated with a source voltage and a grounding voltage of V0 and V5, respectively.

As shown in FIG. 12, in the case where operational amplifiers 11 to 14 are connected as voltage followers, the current flowing in the resistors 1 to 5 can be considerably reduced as compared with the configuration in which the voltage is divided simply by the resistors 1 to 5 to produce a drive voltage. In this way, the output voltage accuracy can be improved. By reason of the fact described below, however, the configuration of FIG. 12 increases the power consumption.

(1) Power is supplied to the operational amplifiers 11 to 14 between the terminals V0in and V5in having the maximum potential difference supplied from an external source. Since the difference is large between this voltage and the output voltages V1 to V4, the potential difference is consumed by heat in the operational amplifiers 11 to 14 connected as series regulators. In the case where a current is supplied from a V3 terminal, for example, the current is supplied from the power terminal V0in, so that the power in terms of the product of a voltage between V0 and V3 and the current supplied to the V3 terminal is consumed as heat in the operational amplifier 13.

(2) Since the self-consumed current of the operational amplifiers 11 to 14 is considerable, a predetermined amount of power is consumed as heat constantly without regard to the power supplied to the liquid crystal display apparatus.

In the method for generating a drive voltage only by resistance-dividing, in spite of its simple construction, the voltage output impedance is required to be reduced. Therefore, the resistance value of the dividing resistors cannot be increased, so that much more power is consumed in the form of heat by the dividing resistors than in the liquid crystal apparatus.

FIGS. 13 and 14 show voltage waveforms for driving the common electrode and the segment electrode in a simple matrix configuration. FIG. 14A shows a drive waveform for the segment when the liquid crystal is turned off for a white display; FIG. 14B shows drive waveform for the segment side when the liquid crystal is entirely turned on for a black display; and FIG. 14C shows a drive waveform for the segment side for the case in which the liquid crystal display apparatus is turned on and off repeatedly along the row for a staggered display. FIG. 15A schematically shows the result of analyzing the current flowing in the liquid crystal panel when the liquid crystal is turned off for a white display. FIG. 15B schematically shows the result of analyzing the current flowing in the liquid crystal panel when it is entirely turned on for a black display. FIG. 15C schematically shows the result of analyzing the current flowing in the liquid crystal panel when the turning on and off is repeated along the row for a staggered display.

As seen from FIG. 15, the current in the liquid crystal display apparatus does not always flow between maximum source voltages V0 and V5. The current I4*c* in FIG. 15C, for example, flows between V0 and V2 or between V3 and V5. Especially, the current 14*c* increases with the number of on/off repetitions along the column of liquid crystal display and assumes a considerable proportion of the whole current. The current indicated by I2*a*, I2*b*, I2*c*, on the other hand, is a current due to the row-selecting pulse of the common output and does not have much effect on the change of current value with display pattern.

The operational amplifiers 11 to 14 including the power line thereof shown in FIG. 12 constituting a drive voltage generating circuit for supplying these currents will be described accurately below with reference to FIG. 16 showing the current flow for the case in which a load 21 having an impedance Z1 is inserted between V0 and V2 and a load 22 having an impedance Z2 is inserted between V3 and V4. In this case, the operational amplifiers 11 to 14 of the same characteristics are used, a no-load current is assumed to be Is, the current flowing in the load 21 to be Iz1, the current flowing in the load 22 to be Iz2, and the control current flowing in the operational amplifiers 11 to 14 is ignored. Also, the dividing resistors 1 to 5 are assumed to have such a large resistance R that the current flowing in the dividing resistors 1 to 5 is ignored. The loads 21, 22 are assumed to operate in such a manner that the load 22 is disconnected when the load 21 is connected, while when the load 21 is disconnected, the load 22 is connected. This operation cycle is repeated in the same ratio of time intervals for the two loads.

In this case, the average power consumed between V0 and V5 is given as $$Ps=(V0-V5)\times\{4Is+(Iz1+Iz2)/2\} \quad (1)$$

The power consumed effectively by the loads, on the other hand, is $$Pz=\{(V0-V2)\times Iz1+(V3-V5)\times Iz2\}/2 \quad (2)$$

Ideally, $$Iz1=Iz2\ (3) \quad (3)$$

Also, from the dividing ratio, $$(V0-V2)/(V0-V5)=(V3-V5)/(V0-V5)=2/b \quad (4)$$

Therefore, the power conversion efficiency is expressed as $$Pz/Ps=2\times Iz1/\{b\times(4Is+Iz1)\} \quad (5)$$

It is thus understood that the power conversion efficiency is very low.

JP-A-5-313612 discloses a configuration for reducing the self current consumption in operational amplifiers under no load. JP-A-5-150736, on the other hand, discloses a configuration in which a sufficient current drive capability is maintained during the discharge of a capacitive load and wasteful power consumption is avoided by reducing the bias current supplied to the differential amplifier circuit after charge or discharge of the capacitive load. In both configurations, only the current Is indicated in the above-mentioned equations is reduced but the voltage is not taken into consideration. The power consumption, therefore, is not reduced sufficiently. Further, since the self current consumption is reduced, the circuit configuration of the operational amplifiers is complicated.

SUMMARY OF THE INVENTION

An object of the invention is to provide a display drive voltage generating apparatus having a simple circuit configuration capable of reducing the power consumption.

The invention provides a display drive voltage generating apparatus which generates a plurality of types of drive voltage required for AC-driving a display apparatus by dividing an input voltage supplied from a DC power supply, the apparatus comprising:

potential correction means for correcting an intermediate voltage to about one half of the input voltage, charge storing means for holding an output voltage of the potential correction means by controlling variation of the output voltage caused due to repeated current flow-in and flow-out, high-potential side drive voltage generating means for generating a drive voltage between a high-potential side voltage and the intermediate voltage, connected between the high potential side of the input voltage and the output side of the potential correction means, and a low-potential side drive voltage generating means for generating a drive voltage between the intermediate voltage and the low-potential side voltage, connected between the output side of the potential correction means and the low-potential side of the input voltage.

According to the invention, since an intermediate voltage derived from the potential correction means for dividing the input voltage to about one half is held by the charge storing means, power for driving a capacitive display unit can be effectively utilized, and power consumption due to voltage drop can be reduced. In addition, since breakown voltages of the high-potential side drive voltage generating means and the low-potential side drive voltage generating means can also be reduced, the power consumption can be reduced with a simple configuration.

Further, the invention is characterized in that the charge storing means is a capacitor, which suppresses variation of the output voltage.

According to this aspect of the invention, since a capacitor is used as the charge storing means, the power consumption can be reduced without complicating the circuit configuration.

Further, the invention is characterized in that the high-potential side drive voltage generating means and the low-potential side drive voltage generating means are operational amplifiers, which stabilize the drive voltage.

According to this aspect of the invention, the high-potential side drive voltage generating means and the low-potential side drive voltage generating means are stabilized by employing operational amplifiers, and thereby the impedance is reduced. The power consumption in generating a potential by resistance-dividing can therefore be reduced.

Further, the invention is characterized in that the high-potential side drive voltage generating means and the low-potential side drive voltage generating means include separated transistor devices for stabilizing the drive voltage.

According to this aspect of the invention, a display drive voltage can be effectively generated using an individual transistor device even in the case where the difference between the source voltage and the output voltage is small.

Further, the invention is characterized in that the potential correction means includes a voltage-regulating diode for dividing the input voltage.

According to this aspect of the invention, a voltage-regulating diode which normally assumes a high impedance is used for correction of the intermediate voltage, and therefore the current consumption can be reduced considerably.

Further, the invention is characterized in that the potential correction means includes:

a resistance type voltage-dividing circuit for dividing the input voltage and generating an intermediate voltage; and a buffer circuit for making the intermediate voltage a low impedance, embodied by a separated transistor.

According to this aspect of the invention, the potential correction means can set the potential variations of the charge storing means within an arbitrary range regardless of the drive voltage value, and therefore the power consumption of the potential correction means can be reduced.

Further, the invention is characterized in that the high-potential side drive voltage generating means and the low-potential side drive voltage generating means generate four types of drive voltages among six types of drive voltages required for driving the liquid crystal display unit.

According to this aspect of the invention, four types of drive voltages out of six types of drive voltages required for driving the liquid crystal display unit can be generated with a simple configuration and a very small power consumption.

Further, the invention is characterized in that the high-potential side drive voltage generating means and the low-potential side drive voltage generating means generate a drive voltage for driving with a bias ratio of one fourth.

According to this aspect of the invention, the power consumption can be considerably reduced even at a high bias ratio of one fourth.

As described above, according to the invention, the power which is conventionally consumed as heat is primarily stored in a charge storing means and effectively used as electric power for driving the display unit to reduce the power consumption. Additionally, the voltage applied to the high-potential side drive voltage generating means and the low-potential side drive voltage generating means represents about one half of the whole input voltage, and therefore reduction of the breakdown voltage of the semiconductor devices, improvement of the integrity of the semiconductor integrated circuit, and cost reduction can be achieved.

According to the invention, the power consumption can be reduced with a simple configuration using a capacitor as the charge storing means.

According to the invention, a display drive voltage can be generated with a low impedance using an operational amplifier, and the source voltage applied to the operational amplifier is about one half of the line voltage. The power consumption and heat generation can thus be reduced.

According to the present invention, since an individual transistor is used for stabilizing the drive voltage, the drive voltage can be produced with high accuracy even when the difference between the source voltage and the output voltage is small, thereby reducing the power consumption.

According to the invention, the intermediate voltage is generated using a voltage-regulating diode and therefore the accuracy of the potential variations can be improved with a simple configuration for a considerably reduced power consumption.

According to the present invention, the intermediate voltage is set arbitrarily by a resistance type voltage-dividing circuit, and is made a low impedance by a buffer circuit embodied by a transistor device to be outputted. Therefore, improvement of the output voltage accuracy and reduction of power consumption can be achieved.

According to the present invention, since four types of drive voltages for driving the liquid crystal display unit are generated with high accuracy and low power consumption. Accordingly, for example, when the liquid crystal display unit is driven by a battery, the battery life is lengthened for an improved utility of the electronic equipment including the liquid crystal display unit.

According to the present invention, the power consumption can be reduced to about one third even when the liquid crystal display unit is driven at a high bias ratio of one fourth.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other and further objects, features, and advantages of the invention will be more explicit from the following detailed description taken with reference to the drawings wherein:

FIG. 14B is a waveform diagram showing a voltage for driving a segment electrode of a liquid crystal panel when the liquid crystal is turned on.

FIG. 15B is a diagram schematically showing the result of analysis of the current flowing in the liquid crystal panel when the liquid crystal is turned on.

DESCRIPTION OF THE PREFERRED EMBODIMENTS

Figure 1:
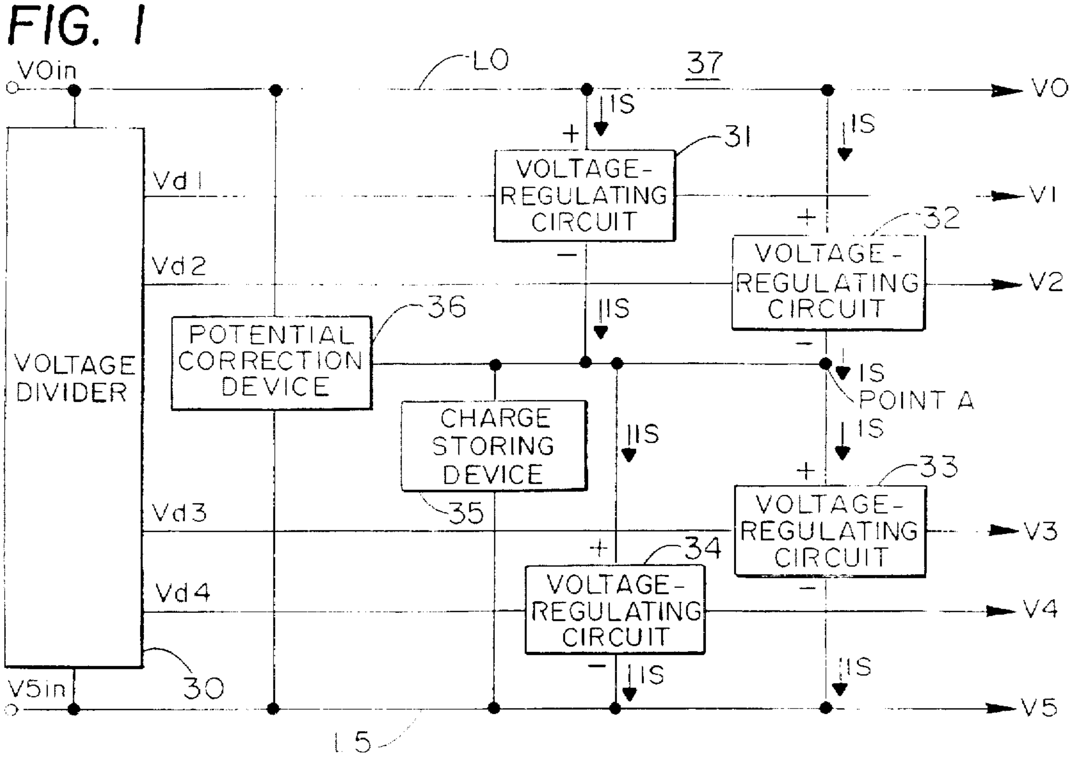
FIG. 1 is a block diagram showing a basic configuration of a drive voltage generating means 37 according to a first embodiment of the invention.

Now referring to the drawings, preferred embodiments of the invention are described below.

FIG. 1 shows a basic electrical configuration according to a first embodiment of the invention. The difference between V0 and V5 applied from a power supply through terminals V0in and V5in is supplied for driving a liquid crystal display unit. A voltage dividing circuit 30 divides the applied voltage and generates four types of voltages Vd1, Vd2, Vd3, Vd4. Each of the voltages Vd1 to Vd4 is converted into a constant voltage by voltage-regulating circuits 31, 32, 33, 34 and is produced as drive voltages V1, V2, V3, V4, respectively. The voltage V0 applied through the terminal V0in is led out as a maximum voltage V0, while the voltage V5 applied through the terminal V5in is led directly as a minimum voltage V5. The voltage-regulating circuits 31 to 34 supply output terminals thereof with currents representing the voltages V1, V2, V3, V4 respectively, or absorbs the current from the output terminals. In the case where the current is supplied thereto in current supply mode, the voltage-regulating circuits 31 to 34 operate as a series regulator for converting the current from a power line L0 supplied with the voltage V0 into a constant voltage. In the case where the current is absorbed thereinto in current absorption mode, on the other hand, the voltage-regulating circuits 31 to 34 function to maintain the output voltage at a constant level by discharging the current from the output terminals to the power line L5 supplied with the voltage V5.

The charge storing means 35 includes a battery of cells and a capacitor. The voltage-regulating circuits 31 and 32 have the positive power supply thereof to line L0, and the negative power supply thereof to the charge storing device 35. The voltage-regulating circuits 33 and 34, on the other hand, have the positive power supply thereof connected to the charge storing device 35, and the negative power supply thereof to line L5. The junction point between the negative power supply side of the voltage-regulating circuits 31, 32 and the positive supply side of the voltage-regulating circuits 33, 34 is assumed to be point A. The point A is further connected with a potential correction device 36 having power supplies of V0 and V5. The potential correction device 36 functions to hold the point A at an intermediate potential between V0 and V5.

Assume that the potential at point A is regulated to an intermediate potential between V0 and V5 by the potential correction device 36. The source current under no load of each of the voltage-regulating circuits 31 to 34 is the same and IS. The same current flows into and flows out of point A connected with the charge storing device 35, so that the potential at point A remains unchanged. The overall configuration of FIG. 1 functions as a drive voltage generating device 37 for a liquid crystal display unit.

Figure 2:
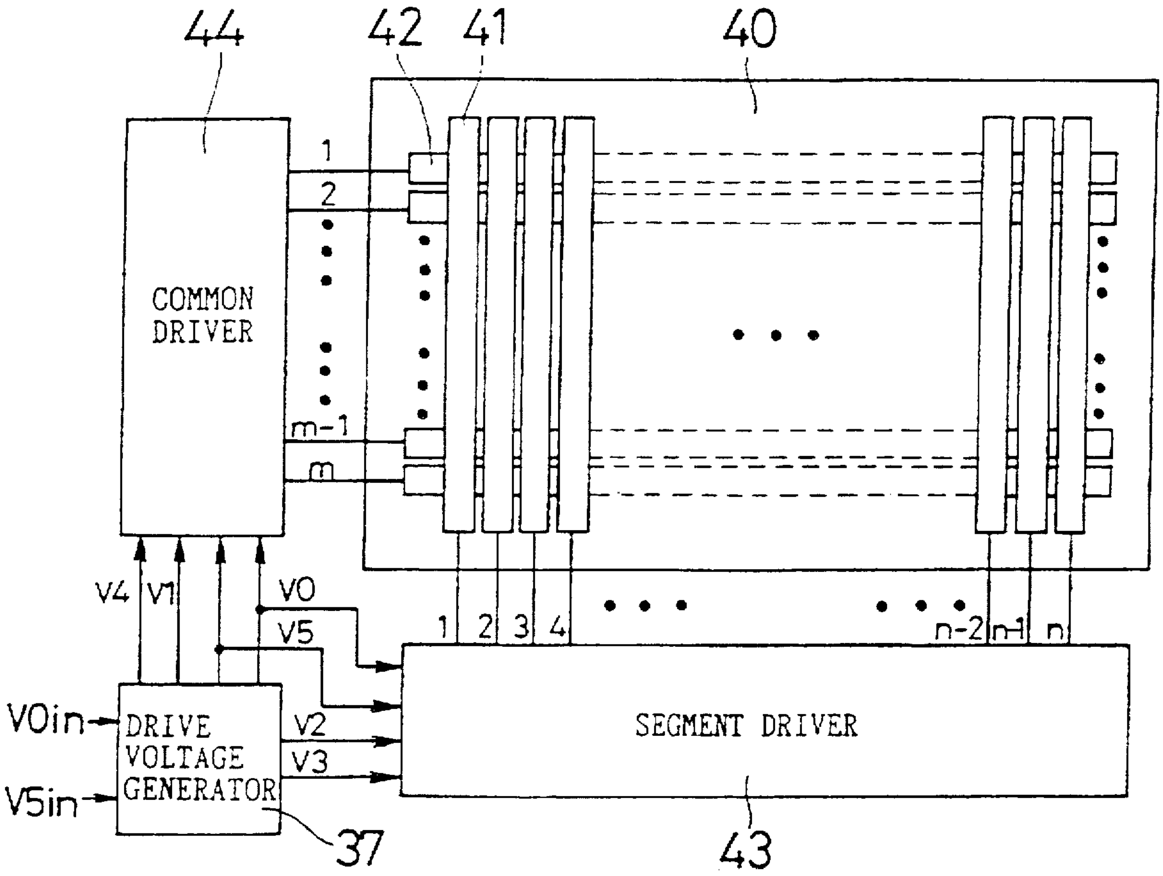
FIG. 2 is a block diagram showing an electrical configuration of a liquid crystal display unit including the drive voltage generating means 37 of FIG. 1.

FIG. 2 shows a simplified electrical configuration for driving a liquid crystal panel 40 using the drive voltage generating device 37 of FIG. 1. The liquid crystal panel 40 includes n segment electrodes 41 and m common electrodes 42 with a liquid crystal material held therebetween. The segment electrodes 41 are connected with a segment driver 43 adapted to selectively switch four types of voltage including V0, V2, V3, V5. The common electrodes 42, on the other hand, are connected with a common driver 44 adapted to selectively switch four types of voltage including V0, V1, V4, V5. The segment driver 43 and the common driver 44 are supplied with six levels of voltage including V0, V1, V2, V3, V4, V5 by the drive voltage generating means 37. In this circuit configuration, all the component parts are not necessarily independent. Instead, the segment driver 43 and the common driver 44, and the drive voltage generating device 37 itself, for example, can be packaged in a single semiconductor integrated circuit.

Figure 15A:
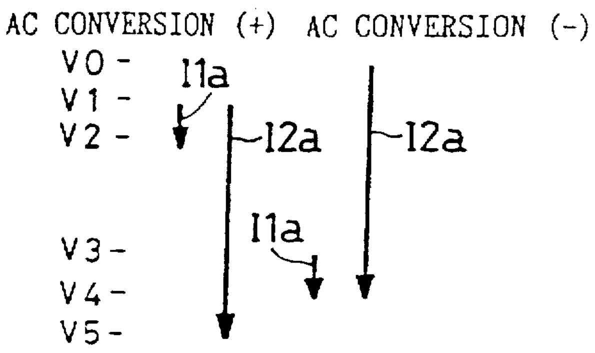
FIG. 15A PRIOR ART
FIG. 15A is a diagram schematically showing the result of analysis of the current flowing in the liquid crystal panel when the liquid crystal is turned off.
Figure 15B:
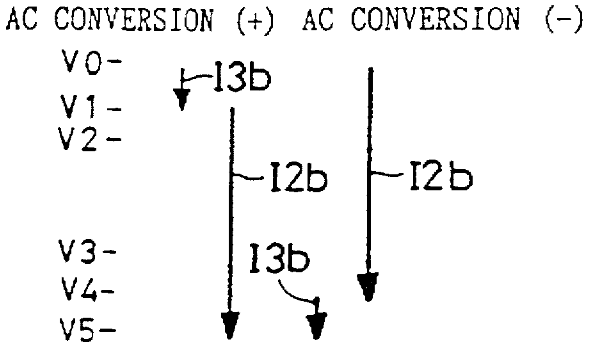
FIG. 15B PRIOR ART
Figure 15C:
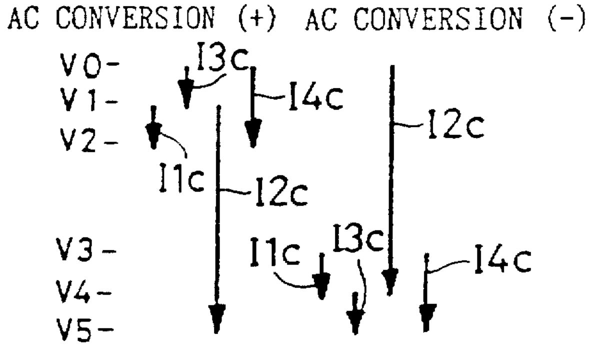
FIG. 15C PRIOR ART
FIG. 15C is a diagram schematically showing the result of analysis of the current flowing in the liquid crystal panel at the time of staggered display of the liquid crystal.
Figure 16:
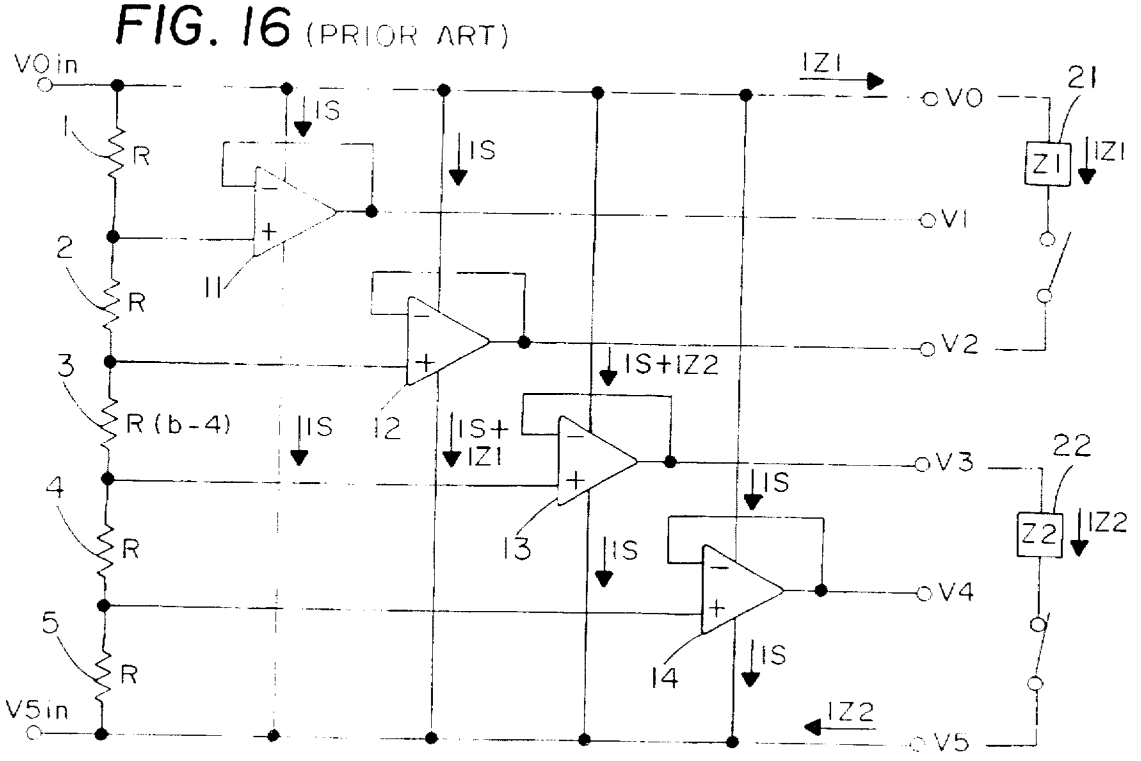
FIG. 16 (PRIOR ART)
FIG. 16 is a diagram showing an electrical circuit for explaining the route of current flowing for driving a load with a configuration of FIG. 12.

The current flowing in the liquid crystal display unit shown in FIG. 2 is accompanied by load variations as shown in FIGS. 15A, 15B, 15C as described above. Among the currents shown in FIG. 15C, note the current I4*c*. This current corresponds to the current flowing between V0 and V2 during the positive AC conversion period, and corresponds to the current flowing between V3 and V5 during the negative AC conversion period.

Figure 3A:
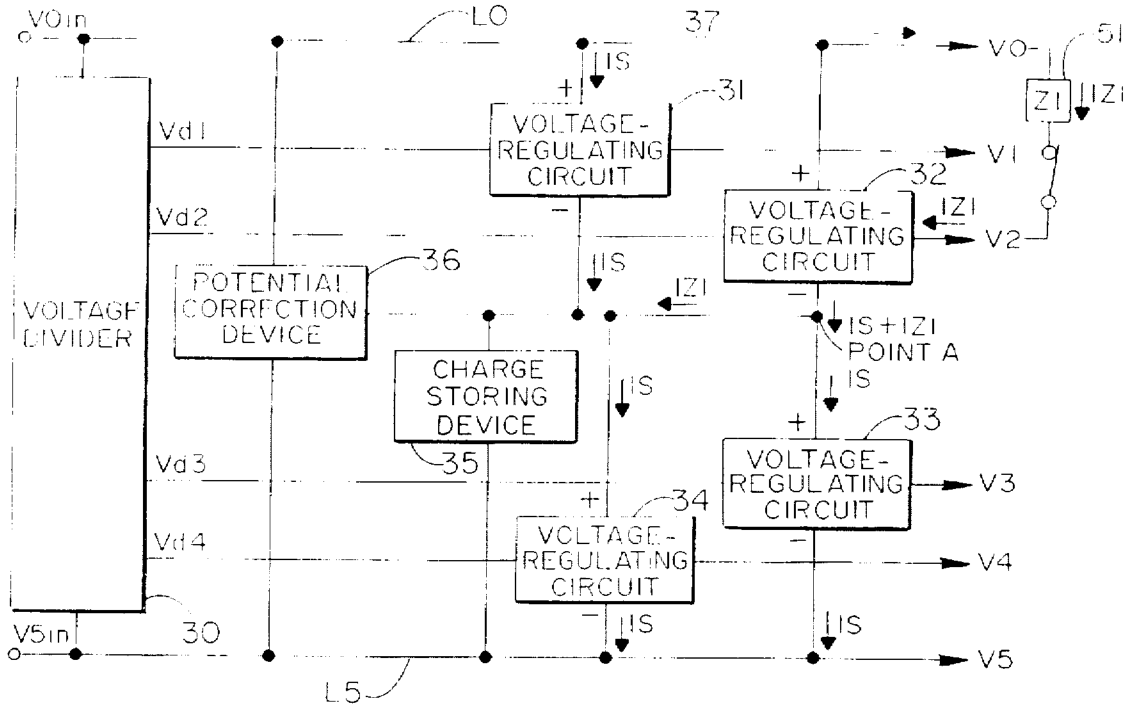
FIG. 3A is a block diagram for explaining the route of current flowing in the drive voltage generating means 37 when a load 51 is connected between voltages V0 and V2.

With a load consuming this current as a model, the current flow to the liquid crystal drive voltage generating a device according to this embodiment will be explained with reference to FIGS. 3A, 3B, 3C. FIG. 3A shows the case in which a load 51 is connected between V0 and V2, and FIG. 3B the case in which a load 52 is interposed between V3 and V5.

As shown in FIG. 3A, when the current IZ1 flows in the load 51 connected between V0 and V2, this current merges with the source current IZ1 of the voltage-regulating circuit 32, and a current IS+IZ1 is supplied to point A from the negative power supply side of the voltage-regulating circuit 32. In the process, the source currents of the other voltage-regulating circuits 31, 33, 34 are IS for both the positive power supply and the negative power supply. The current flowing at point A, therefore, is given from equations 6 and 7 as $$\text{Flow-in current}=2IS+IZ1 \tag{6}$$

$$\text{Flow-out current}=2IS \tag{7}$$

An excess current IZ1 that has flowed in is not consumed in the voltage-regulating circuits 33 and 34, but is stored as charge in the charge storing device 35. The load 51 is separated after a predetermined length of time, and the load 52 is connected. Then, the current IZ2 flows in the load 52 between V3 and V5 as shown in FIG. 3B. This current is supplied from the charge stored in the charge storing device 35, but not from the line L0. Ideally, the currents IZ1 and IZ2 are equal to each other, since the loads 51 and 52 constituting liquid crystal loads have the same characteristics. Even when repeated charge cycles are applied, the operation is repeated. In the process, the charge storing device 35 repeats charge and discharge, and therefore the potential at point A stabilizes while undergoing variations as shown in FIG. 4 at about an intermediate potential between V0 and V5. At this time, assume that $$IZ1=IZ2=IZ \tag{8}$$

Figure 3B:
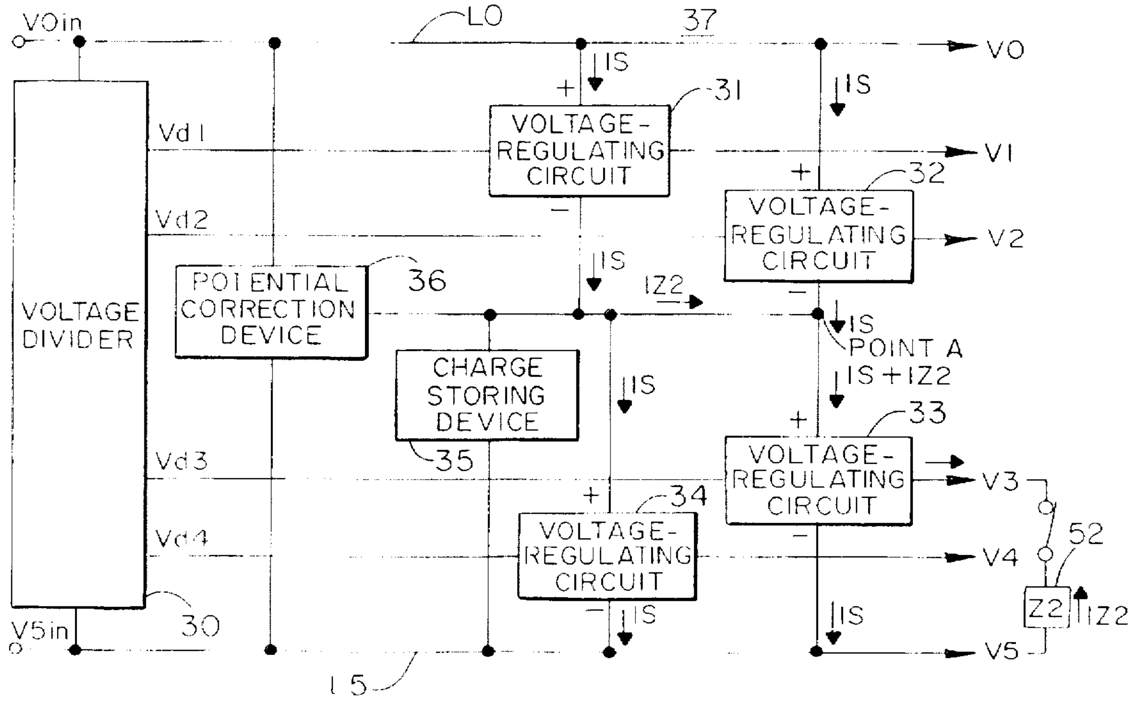
FIG. 3B is a block diagram for explaining the route of current flowing in the drive voltage generating means 37 when a load 52 is connected between V3 and V5.
Figure 4:
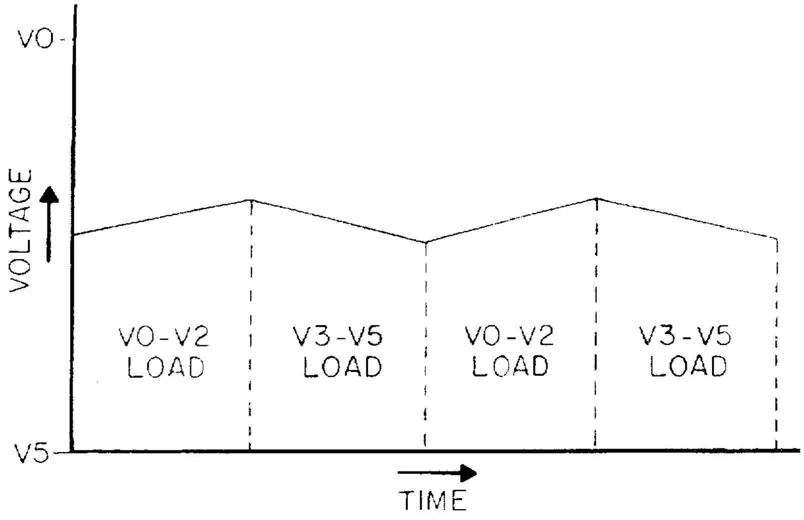
FIG. 4 is graph showing the potential change at point A.

The power consumption of the whole circuit repeating the states of FIGS. 3*a* and 3*b* is expressed by equation 9.

$$PS=(V0-V5)\times(2IS+IZ) \tag{9}$$

As a result, the ratio of the power consumption with the circuit of the conventional system described above is given as $$PS/Ps=(V0-V5)\times(2IS+IZ)/(V0-V5)\times(4Is+Iz) \tag{10}$$

Suppose that the current consumption under no load of the voltage-regulating circuits 31 to 34 is the same as in the conventional system, that is, suppose that the following equation 11 is established.

$$Is=IS \tag{11}$$

This indicates that the same load can be driven with the power consumption equivalent to one half of that required for the conventional system.

Figure 5:
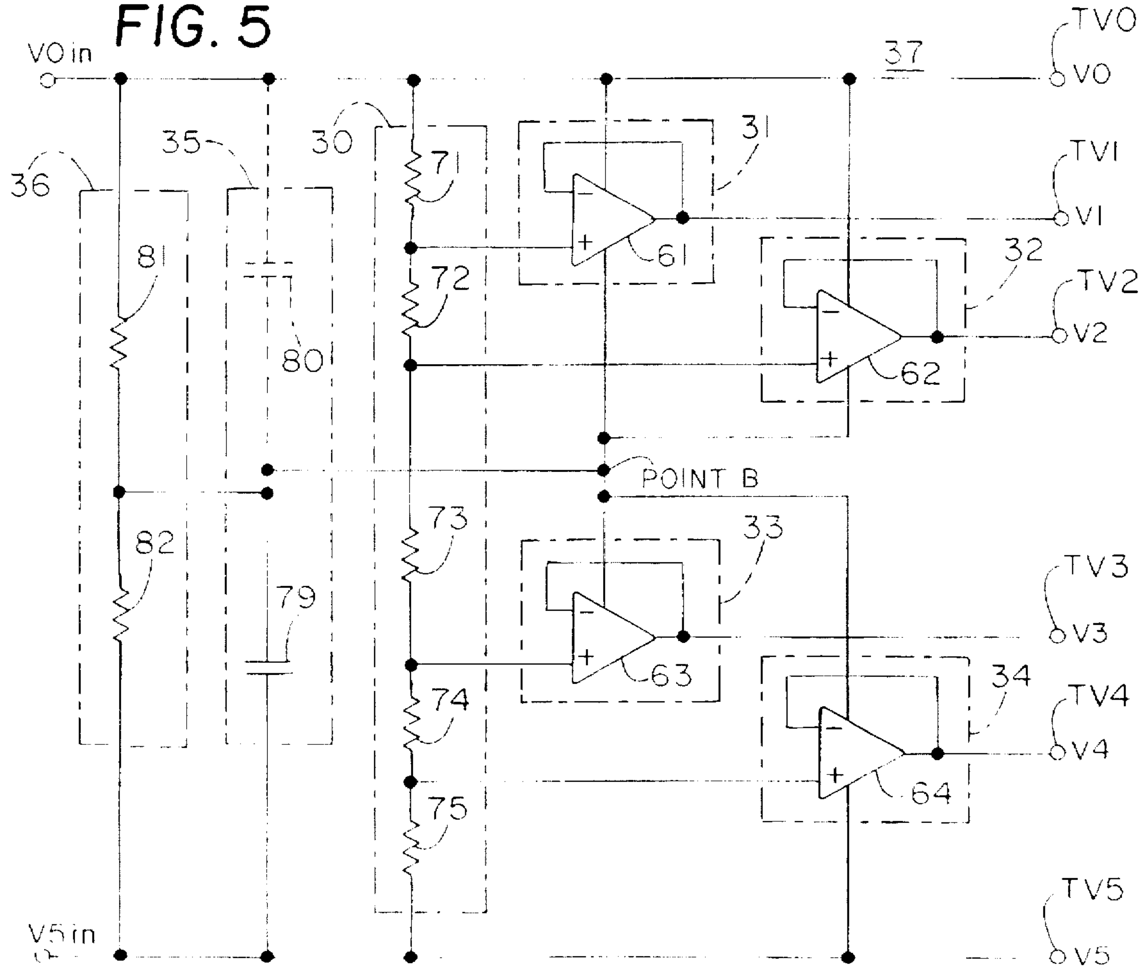
FIG. 5 is a diagram showing an electrical circuit of the drive voltage generating means 37.

FIG. 5 shows an electrical configuration for realizing the basic configuration of FIG. 1 according to the first embodiment of the invention. The operational amplifiers 61, 62, 63, 64 having the same characteristics constitute a voltage follower and realize the voltage-regulating circuits 31 to 34 of FIG. 1.

The voltage-dividing circuit 30 includes resistors 71, 72, 73, 74, 75. The resistors 71 to 75 divide the voltage range between V0 and V5. The resistors 71, 72, 74, 75 have the same resistance value. The resistor 73 has a resistance value expressed as (b−4)R where b is an integer of not less than five.

The potential correction device 36 includes resistors 81 and 82. The potential at point B is corrected by the resistors 81 and 82. The resistors 81 and 82 may have the same resistance value.

The charge storing device 35 has a capacitor 79 as the essential component part thereof. The charge storing device 35 may further have a capacitor 80 shown by dashed line. The capacitor 80 is a voltage-dividing capacitor for transferring the potential at point B to an intermediate voltage between V0 and V5 when a voltage between V0 and V5 is applied. The capacitor 80 is desirably added in the case where the resistors 81, 82 used for correcting the potential have considerably large resistance values, or in the case where the power consumption of the operational amplifiers 61 to 64 is considerably small or in the case where a voltage beyond the source voltage cannot be applied to the operational amplifiers 61 to 64. For explaining the basic operation of the invention, however, the capacitor 80 is not necessarily required. For this reason, the capacitor 80 is assumed to be absent in the description that follows.

Before explaining the case in which a liquid crystal display unit is connected as a load to the drive voltage generating device 37, the behavior of the charges in the liquid crystal display unit will be further described. In the liquid crystal display unit, as described already with reference to the prior art, charge motion is very complicated. The direction of charge motion is shown in FIG. 15. More specifically, however, in the liquid crystal display panel 40 shown in FIG. 2, the current values are estimated as shown in FIG. 15 based on the assumption of the case in which the liquid crystal material is STN, the number n of segment electrodes is 320 and the number m of common electrodes is 240, i.e., on the assumption that an STN panel having a dot matrix of 320×240 is operated. The calculation is an estimation after all and is partially omitted. The liquid crystal panel 40 used for estimation is assumed to have the specification as shown in Table 1 below.

TABLE 1

| | |
|---|---|
| No. of dots in hor. dir. | H = 320 |
| No. of dots in ver. dir. | V = 240 |
| Time-division drive | D = 1/240 Duty |
| Drive frequency | f = 70 Hz |
| AC frequency | Fm = 1120 Hz |
| Drive bias | 1/b = 1/10 |
| Liquid crystal drive voltage | V0 − V5 = 16.5V |
| Dot size | 0.3 × 0.3 mm |
| Liquid crystal cell gap | 6 μm |
| Liquid crystal dielectric constant | on state = 10<br>off state = 4 |

The capacity per dot when the liquid crystal is turned on is determined by equation 12, and that when the liquid crystal is turned off by equation 13. Con designates the capacity when the liquid crystal is turned on and Coff that when the liquid crystal is off.

$$Con=10\times(8.8\times10^{-12})\times(0.3\times0.3\times10^{-6})/(6\times10^{-6}) = 1.32\times10^{-12}[F]=1.32[pF] \quad (12)$$

$$Coff=5.3\times10^{-13}[F]=0.53[pF] \quad (13)$$

First, with regard to the case in which the entire panel is off as shown in FIG. 15A, the current I1a between V1 and V2 represents the transfer of charge generated between the common and segment electrodes when the liquid crystal is AC converted. This current is given as $$\begin{aligned} I1a &= Fm\times Coff\times H\times V\times 2\times(V0-V5)/b \quad (14)\\ &= 1120\times5.3\times10^{-13}\times320\times240\times2\times16.5/10\\ &= 1.5\times10^{-4}(A)=0.15(mA)\end{aligned}$$

The current I2a between V1 and V5 shown in FIG. 15A is expressed by equation 15 below.

$$\begin{aligned} I2a &= (f\times 1/D)\times(Coff\times V)\times(V0-V5)\times(b-1)/b \quad (15)\\ &= (70\times240)\times(5.3\times10^{-13}\times240)\times16.5\times9/10\\ &= 3.2\times10^{-5}(A)=0.032(mA)\end{aligned}$$

Further, with regard to the case where the entire panel is turned on as shown in FIG. 15B, the current I3b between V0 and V1 is given by equation 16 below.

$$\begin{aligned} I3b &= Fm\times Con\times H\times V\times2\times(V0-V5)/b \quad (16)\\ &= 1120\times1.32\times10^{-12}\times320\times240\times2\times16.5/10\\ &= 3.7\times10^{-4}(A)=0.37(mA)\end{aligned}$$

In similar fashion, the current I2b between V1 and V5 in FIG. 15B is as shown in equation 17 below.

$$\begin{aligned} I2b &= (f\times 1/D)\times(Con\times V)\times(V0-V5)\times(b-1)/b \quad (17)\\ &= (70\times240)\times(1.32\times10^{-12}\times240)\times16.5\times9/10\\ &= 7.9\times10^{-5}(A)=0.079(mA)\end{aligned}$$

Also, assuming that the segments repeat on and off with the maximum frequency, the current I4c flowing between V0 and V2 in FIG. 15C is given by equation 18 below.

$$\begin{aligned} I4c &= 1/2\times(f\times 1/D)\times(Con+Coff)/2\times \quad (18)\\ &\quad H\times V\times2\times(V0-V5)/b\\ &= 1/2\times(70\times240)\times(0.53+1.32)\times\\ &\quad 10^{-12}/2\times320\times240\times2\times16.5\times9/10\\ &= 1.97\times10^{-5}(A)=0.0197(mA)\end{aligned}$$

As seen from above, the current flowing between V1 and V5 is comparatively small over the entire display system. In ordinary display conditions, a composite current is considered to flow with the currents I1a, I2a, I3b, I2b, I4c described above as maximum values. Especially, the more the on-off states are repeated on the screen, the more the current I4c becomes dominant, while the other current elements, especially, the current flowing between V1 and V5 becomes negligibly small.

Figure 6A:
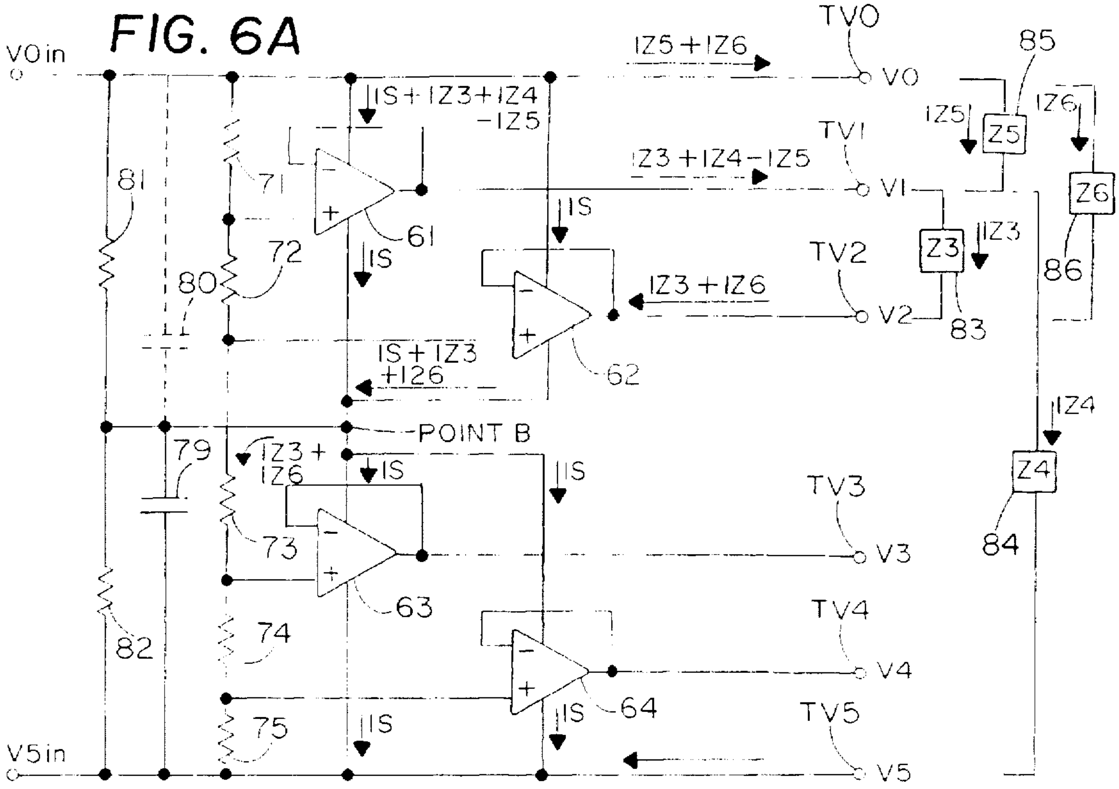
FIG. 6A is a diagram for explaining the route of current flowing during the positive AC conversion period.
Figure 6B:
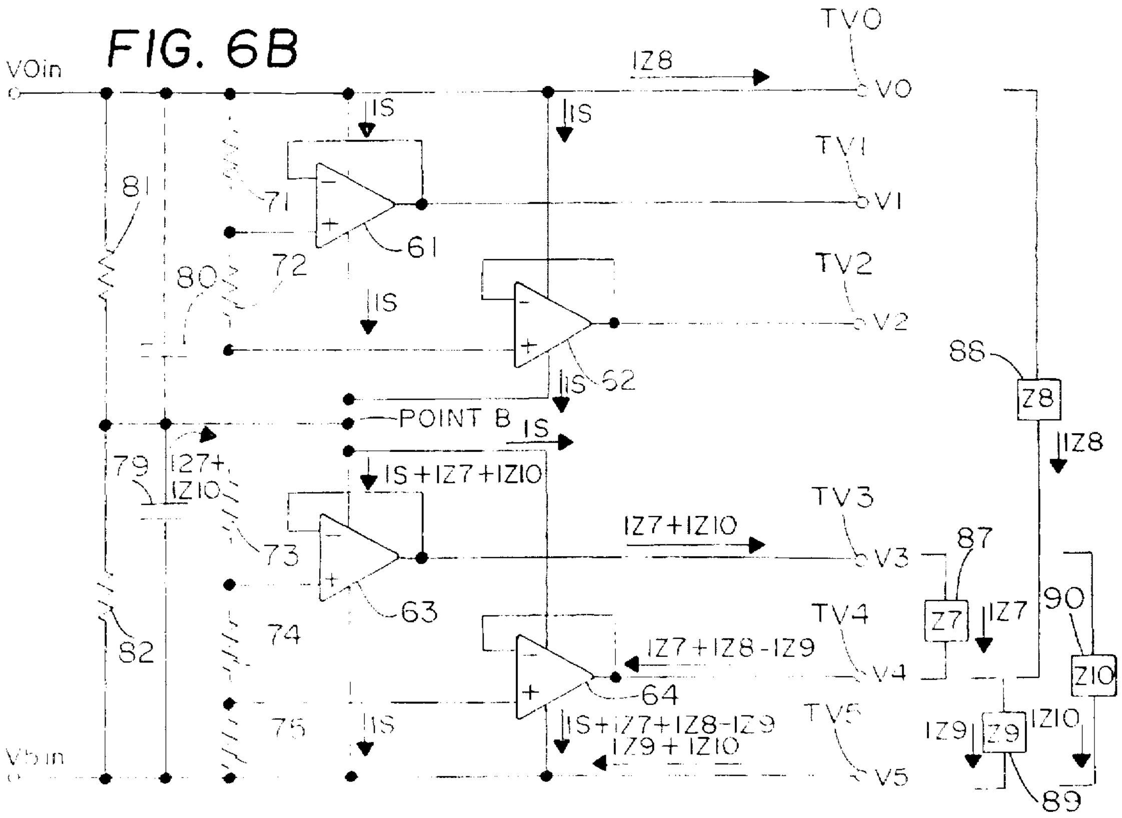
FIG. 6B is a diagram for explaining the route of current flowing during the negative AC conversion period.

The description will be returned to the first embodiment on the basis of the above-mentioned simulation. To facilitate the understanding, a load requiring the current taking the route as shown in FIG. 15C is used as a model of an ordinary case of liquid crystal display. The current flowing in the power lines of the operational amplifiers 61 to 64 is shown in FIG. 6. FIG. 6A shows a model for the positive AC conversion period shown in FIG. 15C, and FIG. 6B a model for the negative AC conversion period. In FIG. 6A, the loads 83, 84, 85, 86 are those assumed in the liquid crystal panel, which respectively correspond to the currents I1c, I2c, I3c, I4c shown in FIG. 15C.

In the liquid crystal display unit, in order to prevent the DC voltage from being applied to the liquid crystal material, the positive AC conversion period and the negative AC conversion period are alternated with each other, so that the positive AC conversion time is equal to the negative AC conversion period per unit time.

By way of explanation, it is assumed that the potential at point B is intermediate. The process of point B assuming an intermediate potential is described below.

First, when power is switched on between V0 and V5, the potential across the capacitor 79 is V5. After that, the capacitor 79 is charged by the current flowing in the operational amplifiers 61 and 62. With steady increase in the potential at point B, the current for charging the capacitor 79 through the operational amplifiers 61 and 62 decreases. At the same time, an increased current is discharged through the operational amplifiers 63 and 64. At the final point when the potential at point B reaches the intermediate potential between V0 and V5, the current flowing in the operational amplifiers 61, 62, 63 and 64 reach the same level. As a result, a small correction current flows through the resistors 81 and 82 to maintain an intermediate potential, so that the point B secures an intermediate potential.

Under this condition, assume that the load as shown in FIG. 6A is applied during the positive AC conversion period. Assume that currents IZ3, IZ4, IZ5, IZ6 flow in the loads 83, 84, 85, 86, respectively, having impedances Z3, Z4, Z5, Z6. The currents as shown in Table 2 below are supplied from terminals TV0, TV1, TV2, TV3, TV4, TV5.

TABLE 2

| | |
|---|---|
| Terminal TV0 | IZ5 + IZ6 |
| Terminal TV1 | IZ3 + IZ4 − IZ5 |
| Terminal TV2 | −(IZ3 + IZ6) |
| Terminal TV3, TV4 | 0 |
| Terminal TV5 | −IZ4 |

It follows that when inequality 19 is satisfied, the load is supplied with a current through the terminal TV1.

$$IZ3+IZ4-IZ5>0 \tag{19}$$

In the process, the current flowing in the positive power supply and the negative power supply of the operational amplifiers 61 to 64 as shown in FIG. 6A is given in Table 3 below.

TABLE 3

| Operational amplifier | Positive source current | Negative source current |
|---|---|---|
| 61 | IS + IZ3 + IZ4 − IZ5 | IS |
| 62 | IS | IS + IZ3 + IZ6 |
| 63, 64 | IS | IS |

The sum of the currents flowing in and out at point B is given as IZ3+IZ6. This current is stored as a charge in the capacitor 79. In the case where inequality 20 shown below is established, the current IS flows in the positive power supply of the operational amplifier 61, and the current IS −(IZ3+IZ4−IZ5) flows from the negative power supply. The charge stored in the capacitor 79 thus increases by −(IZ3+IZ4−IZ5). This process will not be described.

$$IZ3+IZ4-IZ5<0 \tag{20}$$

where −(IZ3+IZ4 −IZ5)>0.

Now, assume the case in which a load as shown in FIG. 6B is imposed during the negative AC conversion period. Also, assume that the currents flowing in the loads 87, 88, 89, 90 having the impedances Z7, Z8, Z9, Z10 are IZ7, IZ8, IZ9, IZ10, respectively. The currents supplied from the voltage lines V0, V1, V2, V3, V4, V5 are as shown in Table 4 below.

TABLE 4

| | |
|---|---|
| Terminal TV0 | IZ8 |
| Terminal TV1, TV2 | 0 |
| Terminal TV3 | IZ7 + IZ10 |
| Terminal TV4 | −(IZ7 + IZ8 − IZ9) |
| Terminal TV5 | −(IZ9 + IZ10) |

Suppose that −(IZ7+IZ8 −IZ9)<0, i.e., that the current flows in from the load through the terminal TV4. The currents flowing in the positive power supply and the negative power supply of each operational amplifier is given in Table 5.

TABLE 5

| Operational amplifier | Positive source current | Negative source current |
|---|---|---|
| 61, 62 | IS | IS |
| 63 | IS + IZ7 + IZ10 | IS |
| 64 | IS | IS + (IZ7 + IZ8 − IZ9) |

Calculating the sum of the currents flowing in and out at point B, it is found that a current IZ7+IZ10 flows out from point B.

In the liquid crystal drive voltage generating device 37, the voltages of V0–V1, V1–V2, V3–V4 and V4–V5 are de-signed to assume the same value. Ideally, Z3=Z7, Z4=Z8, Z5=Z9 and Z6=Z10. Thus the current IZ3+IZ6 flowing into point B during the positive AC conversion period is equal to the current IZ7+IZ8 flowing out from point B during the negative AC conversion period.

Consequently, in the case where only the current supplied from the terminal TV0 is watched, the current $I^+$ flowing between V0 and V5 during the positive AC conversion period is given from equation 21.

$$I^+=(IZ5+IZ6)+(IS+IZ3+IZ4-IZ5)+IS$$
$$+2IS+IZ3+IZ4+IZ6 \tag{21}$$

Also, the current $I^-$ flowing between V0 and V5 during the negative AC conversion period is determined from equation 22.

$$I^-=2IS+IZ8 \tag{22}$$

The positive AC conversion period and the negative AC conversion period alternate with each other. The average current $I_{AVE}$, therefore, is expressed by equation 23.

$$I_{AVE}=(I^++I^{31})/2=2IS+IZ4+(IZ3+IZ6)/2 \tag{23}$$

The average current $I_{AVE}$ in the prior art is given by equation 24, so that the ratio with respect to the conventional method is expressed by equation 25.

$$I_{AVE}(conv.) = 4IS + IZ3 + IZ4 + IZ6 \tag{24}$$

$$\frac{I_{AVE}}{I_{AVE}(conv.)} = \frac{2IS + IZ4 + (IZ3 + IZ6)/2}{4IS + IZ3 + IZ4 + IZ6} \tag{25}$$

As described above, IZ4 is smaller than IZ3, and the higher the on-off repetition of the liquid crystal panel, the higher the ratio of IZ6. When this is taken into consideration, the ratio approaches the ratio of ½ infinitely for the standard display.

According to this embodiment, the minimum value of the capacitance of the capacitor 79 used as the charge storing device 35 is determined by equation 26 below from the relation between the voltage variation Δ V to be satisfied during AC conversion and the transferred charge amount Δ Q obtained by integrating the flow-in current value.

$$C=\Delta Q/\Delta V \qquad (26)$$

In the case of the liquid crystal panel 40, for example, the transferred charge amount associated with IZ6 representing the maximum charge transfer is calculated from equation 27 as shown below.

$$\Delta Q=(\mathrm{Con}+\mathrm{Coff})/2\times320\times240\times2\times(V0-V5)/b$$

$$=2.2\times10^{-7}[C] \qquad (27)$$

As a result, an attempt to control the voltage variation within 1 V will succeed if the capacitance is set to the lowest limit defined by equation 28.

$$C=2.2\times10^{-7}/1=2.2\times10^{-7}[F]=0.22[\mu F] \qquad (28)$$

The resistors 81 and 82 arranged as the potential correction device 36, though shown inserted between V0 and point B and between point B and V5, respectively, are not necessarily interposed between V0 and V5, but between divided output voltages. The insertion between V1 and V4 or between V2 and V3, for example, improves the regulation ability for correction of the potential at point B since the potential difference is reduced and a lower current can be realized with the same resistance value. The potential correction device 36, which sets the intermediate potential at point B in initial state, is also used for the following explanation.

Ideally, the voltage is set to the same level between V0 and V1, between V1 and V2, between V3 and V4 and between V4 and V5. Actually, however, it is difficult to set so due to the effect of variations in dividing resistors, the offset voltage of the operational amplifiers 61 to 64 and the bias current. Different potential differences fail to establish, though only slightly, the relations of IZ3=IZ7, IZ4=IZ8, IZ5=IZ9, and IZ6=IZ1 0. A circuit is required, therefore, to accommodate this current difference and correct the point B always to an intermediate potential. However, the current difference, if any, is so small that it can be ignored for the drive voltage generating device 37 as a whole. A comparatively large resistance value can thus be used for the resistors 71 to 75, 81, 82.

With a liquid crystal display unit of 320×240 dots similar to the above-mentioned model, a comparison between the present embodiment and the conventional method is shown in Table 6 below.

TABLE 6

| | Measurements | | | Calculations | | |
|---|---|---|---|---|---|---|
| | Embodiment | Prior art | Ratio | Embodiment | Prior art | Ratio |
| White display | 0.27mA | 0.55mA | 49% | 0.267mA | 0.502mA | 53% |
| Black display | 0.34mA | 0.64mA | 53% | 0.424mA | 0.769mA | 55% |
| Checked display | 1.2mA | 2.3mA | 52% | 1.386mA | 2.661mA | 52% |

In Table 6, the actual measurements and the calculated values are substantially similar to each other. The actual measurements are slightly larger in the rate of reduction than the calculated values, because the current values under no load of the operational amplifiers are assumed to be the same in the present embodiment as in the prior art for the purpose of calculations. The source current of the actual operational amplifiers is smaller, the lower the source voltage. This is seen as another reason that the current is reduced to about one half.

Assume the case where the bias ratio (V0–V1)/(V0–V5) that is the ratio of the voltage between V0 and V1 to the voltage between V0 and V5 is small for the liquid crystal drive power unit. The resistance value of the resistors 81, 82 of FIG. 5 can be comparatively increased, if V0–V1=V1–V2=V3–V4=V4–V5. Although the resistors 81, 82 are used as the potential correction device 36, the voltage variations can be substantially ignored. By increasing the resistance value, the current value between V0 and V5 can be controlled to a small level. The potential correction device 36 using resistors such as this is very low in cost and easy to realize. With the increase in bias ratio, however, the voltage accuracy of the potential correction device 36 is required to be improved.

Figure 7:
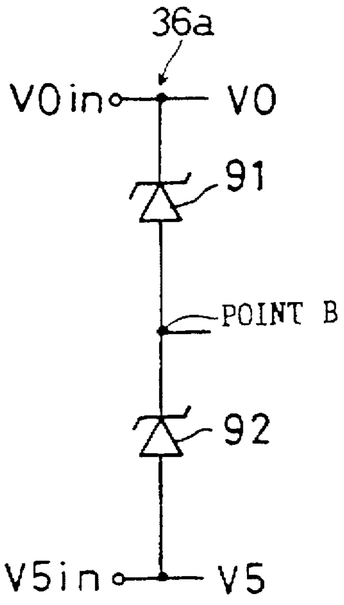
FIG. 7 is a diagram showing an electrical circuit of potential correction means **36*a*** according to a second embodiment.

FIG. 7 schematically shows an electrical configuration of the potential correction device **36*a* according to a second embodiment of the invention. The potential correction device 36*a* has replaced the potential correction device 36 of the above-mentioned drive, voltage generating device 37. The potential correction device 36*a* includes voltage-regulating diodes 91, 92, and is higher in accuracy of the potential corrected than the potential correction device 36. The breakdown voltage Vz of each of the voltage-regulating diodes 91, 92** is selected to satisfy the conditions of inequality 29 shown below.

$$Vz>(V0-V5)/2 \qquad (29)$$

This circuit operates as described below. First, the potential at point B drops, and when the condition of inequality 30 below is met, a current is supplied to point B through the voltage-regulating diode 91. In the process, the voltage across the voltage-regulating diode 92 is not higher than the breakdown voltage Vz, and therefore the voltage-regulating diode 92 substantially reaches a high-impedance state, so that the power consumption is remarkably reduced.

$$(V0-\text{Potential at point }B)\geqq Vz \qquad (30)$$

In the case where the potential at point B rises, on the other hand, the voltage-regulating diode 92 discharge the charge from point B. As a result, the potential at point B is held within the range defined by inequality 31.

$$Vz\geqq\text{Potential at point }B\geqq(V0-V5)-Vz \qquad (31)$$

In inequality 31, especially when inequality 32 below holds at the same time, the leak current flowing between V0 and V5 can be controlled to a low level. Consequently, the provision of the potential correction device **36*a*** can reduce the reactive current and realize a drive voltage generating means high in accuracy.

$$Vz>\text{Potential at point }B>(V0-V5)-Vz \qquad (32)$$

Figure 8:
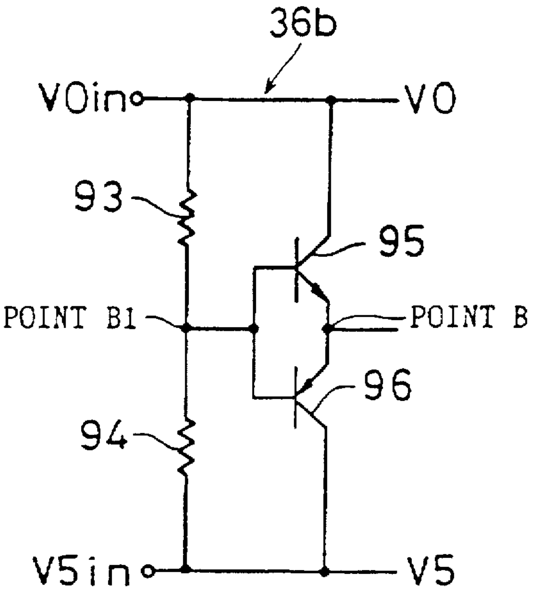
FIG. 8 is a diagram showing an electrical circuit of a potential correction means **36*b*** according to a third embodiment.

FIG. 8 shows a configuration of a potential correction device **36*b* according to the third embodiment of the invention. The potential correction device 36*b* has replaced the potential correction device 36 of the drive voltage generating device 37 described above. According to this embodiment, a voltage-dividing circuit including the resistors 93, 94 maintains the potential at point B1 at an intermediate potential of (V0–V5)/2, which is applied to the common base of a complementary circuit including an NPN transistor 95 and a PNP transistor 96. When the potential at point B on the common emitter side drops and the base-emitter voltage VBE of the transistor 95 turns on, then a current is supplied from the collector to the emitter of the transistor 95, thereby increasing the potential at point B. With the rise of potential at point B and the resulting turning on of the base-emitter voltage of the transistor 96, on the other hand, the potential at point B drops due to the discharge from the emitter to the collector of the transistor 96**. As a result, the potential at point B settles within the range of inequality 33.

$$(V0-V5)/2+V_{BE} \geqq \text{Potential at point } B \geqq (V0-V5)/2-V_{BE} \quad (33)$$

The base-emitter voltage $V_{BE}$ of a bipolar transistor is about 0.6 V, and therefore point B holds a potential of (V0–V5)/2}±0.6 V. If the potential correction means **36*b*** is configured this way, the intermediate potential can be held with high accuracy even when the voltage changes between V0 and V5.

Figure 9:
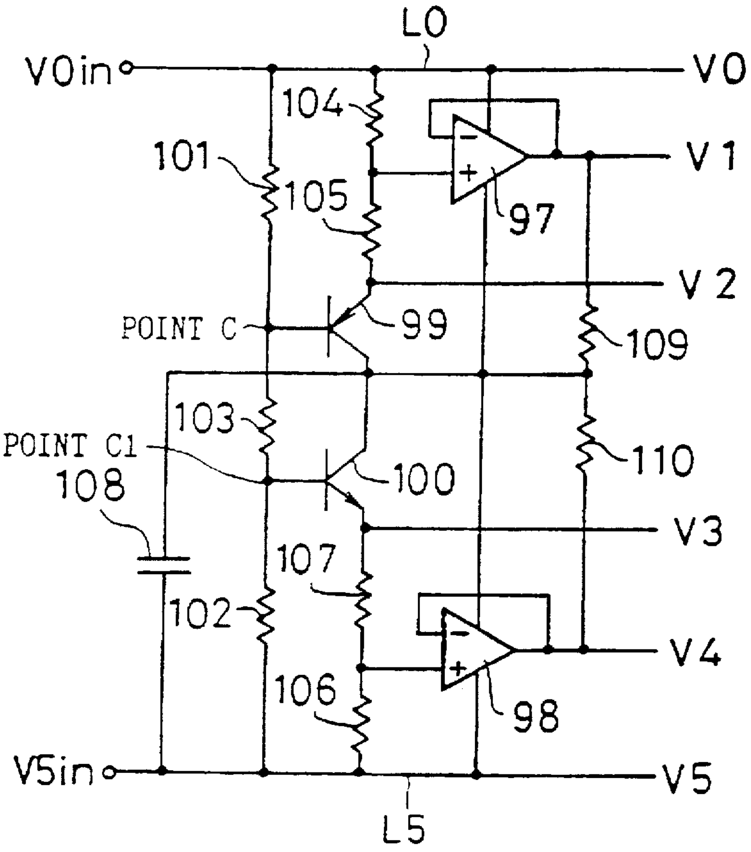
FIG. 9 is a diagram showing an electrical circuit according to a fourth embodiment of the invention.

FIG. 9 shows a configuration according to a fourth embodiment of the invention. According to this embodiment, the operation is possible even with the bias ratio of 1/5. This embodiment therefore is applicable preferably to a system requiring a higher bias than the first embodiment. Operational amplifiers 97, 98, as a voltage follower, produce voltages V1, V4 with a low output impedance. A PNP transistor 99 and an NPN transistor 100 also produce voltages V2, V3 with the output impedance thereof reduced as an emitter follower. Resistors 101 to 107 are voltage-dividing resistors, a capacitor 108 is a charge storing device, and resistors 109, 110 make up a potential correction device. Generally, in an operational amplifier configured of a bipolar transistor, the range of the output voltage controllable with respect to a source voltage Vcc of the operational amplifier itself is limited as shown inequality 34 below.

$$1.0\ V \leqq \text{Output voltage} \leqq Vcc-1.0\ V \quad (34)$$

Generally, the voltage between V0 and V1, though somewhat depending on the duty factor, is set to about 1.5 to 2 V. An attempt to realize the bias ratio of 1/5 in the first embodiment would make it impossible to secure the potential difference of other than about 0.75 to 1 V between the V0–V5 intermediate potential and V2 or V3. The operation is impossible in this state. If a CMOS operational amplifier is used, by contrast, the relation of "source voltage range= input voltage range=output voltage range", i.e., what is called the rail-to-rail output swings can be satisfied at the sacrifice of high cost.

According to this embodiment, the resistors 101 to 103 are used for voltage division in such a manner that the voltages at points C and C1 of the voltage-dividing circuit assume values of V2–$V_{BE}$ of the transistor and V3+$V_{BE}$ of the transistor, respectively. The resistors 101, 102 have the same resistance value. Further, the line L0 and the emitter of the transistor 99 are connected to each other through two resistors 104, 105 in series having the same resistance value. The junction of the resistors 104 and 105 is connected to the non-inversion input terminal of the operational amplifier 97. In similar fashion, two resistors 106, 107 in series having the same resistance value are interposed between the line L5 and the emitter of the transistor 100, and the joint thereof is connected to the non-inversion input terminal of the operational amplifier 98. As a result, V1 assumes a voltage obtained by equally dividing between V0 and V5, and V4 a voltage obtained by equally dividing between V4 and V5. Equation 35 thus is obtained.

$$V0-V1=V1-V2=V3-V4=V4-V5 \quad (35)$$

Further, by properly selecting the relation of resistance values, the conditions of equation 36 can be set.

$$(V0-V1)/(V0-V5)=1/5 \quad (36)$$

At this time, the voltage range V3–V5 of course equals the voltage range V0–V1. Even when only 1.5 can be secured at minimum as described above, the base-emitter voltage $V_{BE}$ of the transistor is about 0.6 V. The potential difference of 1.5 V −1 0.6×2=0.3 V can therefore be secured between points C and C1. As a result, the operation is possible. Although the transistors 99, 100 are used as a voltage-regulating circuit for V2, V3, the operation is possible since the V2 output is only for current absorption, and the V3 output only for current output.

Figure 10:
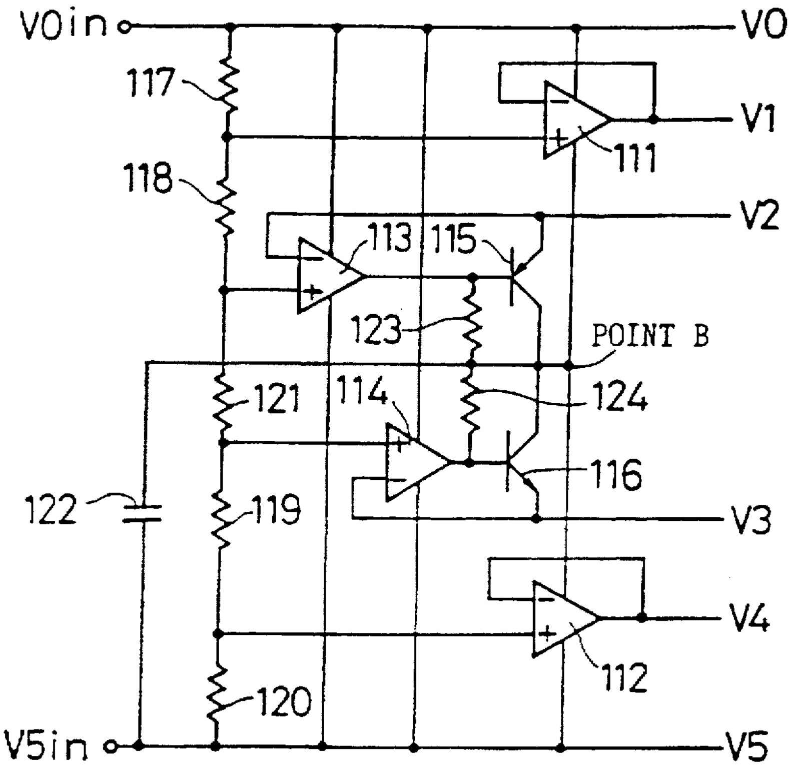
FIG. 10 is a diagram showing an electrical circuit according to a fifth embodiment of the invention.

FIG. 10 shows a configuration of a fifth embodiment of the invention. This embodiment is preferably applicable to the case in which the bias ratio is higher or in which the current load variations for V2, V3 are considerably large. The present embodiment, which is similar to the first embodiment shown in FIG. 5, has a noted difference in that operational amplifiers 113, 114 are inserted between V0 and V5.

The output terminal of the operational amplifier 113 is connected with the base of a PNP transistor 115, the emitter of which is connected to the inversion input terminal of the operational amplifier 113. The emitter voltage of the PNP transistor 115 and the voltage of the inversion input terminal of the operational amplifier 113 assume a voltage V2. The output terminal of the operational amplifier 114 is connected to the base of an NPN transistor 116, the emitter of which is connected to the inversion input terminal of the operational amplifier 114. The emitter voltage of the NPN transistor 116 and the voltage of the inversion input terminal of the operational amplifier 114 assume a voltage V3.

In this way, an operation is possible as an apparently single voltage-regulating circuit by connecting operational amplifiers and transistors. Consequently, the non-inversion input voltage of the operational amplifier 113 can be held at high accuracy by the voltage V2.

The collector of the transistor 115 is connected to a capacitor 122 constituting a charge storing device. The current absorbed by way of V2, except for the base current of the transistor 115, is charged to the capacitor 122 through point B. The base current is obtained as the collector current divided by the DC amplification factor of the transistor, and therefore the current from V2 is mostly stored in the capacitor 122. A similar operation can also be performed by a combination of the operational amplifier 114 and the transistor 116.

In the process, the minimum potential difference between V2 and potential at point B or between potential at point B and V3 is determined by the collector saturation voltage of the transistor. Depending to a large measure on the current value, the collector saturation voltage is about 0.1 V for a low current value. A stable voltage output can be produced, therefore, even with a very small potential difference.

According to this embodiment, the operational amplifiers 113, 114 operate with the voltage range V0–V5 as a power supply, it therefore follows that a no-load current value IS is increased by an amount equivalent to one operational amplifier. A comparison of average voltage between the prior art and the embodiment is shown in equation 37. This indicates the superiority of the embodiment over the prior art. The potential at point B is required to be controlled with very high accuracy. The configuration of the potential correction device, therefore, must be realized with resistors 123, 124 connected between V2 and V3.

$$\frac{I_{AVE}}{I_{AVE}(conv.)} = \frac{3IS + IZ4 + (IZ3 + IZ6)/2}{4IS + IZ3 + IZ4 + IZ6} \quad (37)$$

Figure 11:
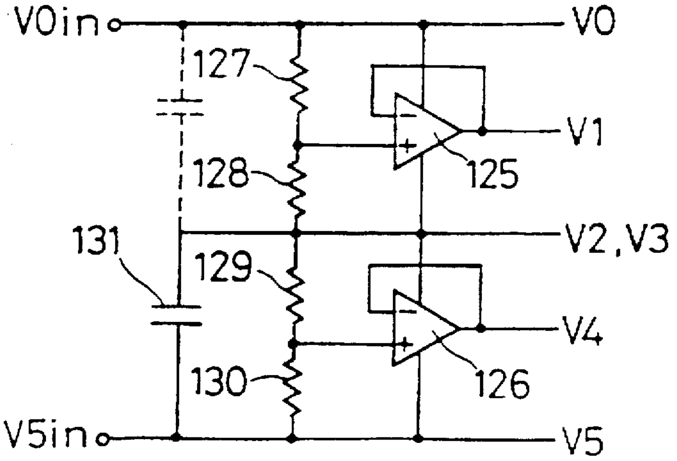
FIG. 11 is a diagram showing an electrical circuit according to a sixth embodiment of the invention.
Figure 12:
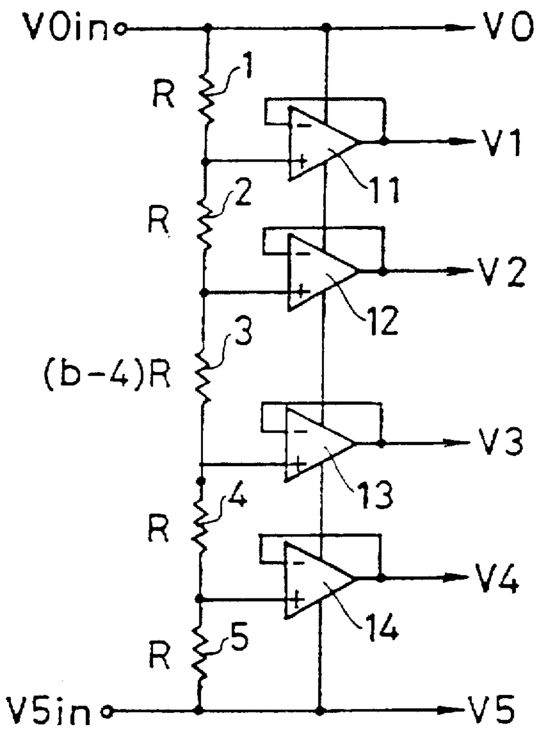
FIG. 12 PRIOR ART
FIG. 12 is a diagram showing an electrical circuit of a conventional liquid crystal drive voltage generating means.
Figure 13:
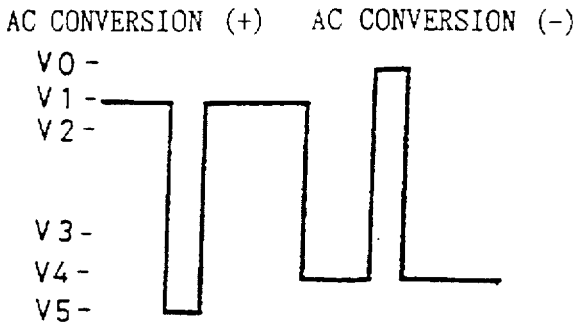
FIG. 13 PRIOR ART
FIG. 13 is a waveform diagram showing a voltage for driving a common electrode of a liquid crystal panel.
Figure 14A:
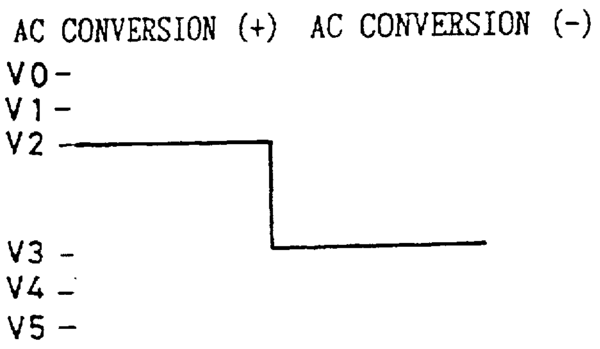
FIG. 14A PRIOR ART
FIG. 14A is a waveform diagram showing a voltage for driving a segment electrode of a liquid crystal panel when the liquid crystal is turned off.
Figure 14B:
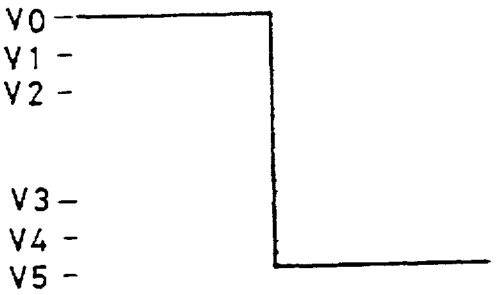
FIG. 14B PRIOR ART
Figure 14C:
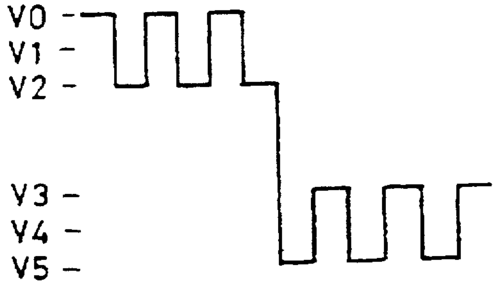
FIG. 14C PRIOR ART
FIG. 14C is a waveform diagram showing a voltage for driving a segment electrode of a liquid crystal panel at the time of staggered display of the liquid crystal.

FIG. 11 shows a configuration of a sixth embodiment. This embodiment of the invention is preferably applicable to the case in which a high bias ratio of ¼ is employed. The resistors 127 to 130 having the same resistance value double as a voltage divider and a potential correction device at the same time. Since V2=V3 and the same output line is used for supplying and absorbing the current, a capacitor 131 is connected directly without the intermediary of an operational amplifier or the like. The voltage variation between V2 and V3 is required to be controlled to about several tens of mV. The capacitance C of the capacitor 131 can be calculated in the same manner as in the first embodiment. The improvement realized by the present embodiment is shown by equation 38.

$$\frac{I_{AVE}}{I_{AVE}(conv.)} = \frac{IS + IZ4 + (IZ3 + IZ6)/2}{3IS + IZ3 + IZ4 + IZ6} \quad (38)$$

An improvement is secured any way. The bias ratio of ¼ is used for a comparatively small display unit having a duty factor of ⅓ to ¼. It therefore sometimes holds true that the no-load current of the operational amplifier is more controlling than the current consumed in the liquid crystal. Depending on a particular system, therefore, the power consumption can be reduced to about ⅓.

Although a liquid crystal display unit is driven in the embodiments described above, an electroluminescence (EL) can similarly be driven with equal effect.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A display drive voltage generating apparatus which generates a plurality of types of drive voltage required for AC-driving a display apparatus by dividing an input voltage supplied from a DC power supply, the apparatus comprising:

potential correction means for correcting an intermediate voltage to about one-half of the input voltage;

charge storing means for holding an output voltage of the potential correction means by controlling variation of the output voltage caused by repeated current flow-in and flow-out;

high-potential side drive voltage regulating means for regulating a drive voltage between a high-potential side voltage and the intermediate voltage, connected between the high-potential side of the input voltage and an output side of the potential correction means; and low-potential side drive voltage regulating means for regulating a drive voltlage between the intermediate voltage and the low-potential side voltage, connected between the output side of the potential correction means and a low-potential side of the input voltage.

2. The display drive voltage generating apparatus of claim 1, wherein the charge storing means is a capacitor, which suppresses variation of the output voltage.

3. The display drive voltage generating apparatus of claim 1, wherein the high-potential side drive voltage regulating means and the low-potential side drive voltage regulating means are operational amplifiers, which stabilize the drive voltage.

4. The display drive voltage generating apparatus of any one of claims 1 to 3, wherein the high-potential side drive voltage regulating means and the low-potential side drive voltage regulating means include separated transistor devices for stabilizing the drive voltage.

5. The display drive voltage generating apparatus of claim 1, wherein the potential correction means includes a voltage-regulating diode that receives the high-potential side voltage and the low-potential side voltage for correcting the intermediate voltage.

6. The display drive voltage generating apparatus of claim 1, wherein the potential correction means includes:

a resistance type voltage-dividing circuit for dividing the input voltage and generating the intermediate voltage; and a buffer circuit for making the intermediate voltage a voltage of a low impedance, embodied by a separated transistor.

7. The display drive voltage generating apparatus of claim 1, wherein the high-potential side drive voltage regulating means and the low-potential side drive voltage regulating means generate four types of drive voltages among six types of drive voltages required for driving the liquid crystal display unit.

8. The display drive voltage generating apparatus of claim 7, wherein the high-potential side drive voltage regulating means and the low-potential side drive voltage regulating means generate a drive voltage for driving with a bias ratio of one fourth.

9. A voltage generating apparatus for generating a plurality of voltages for driving a display apparatus from an input voltage, comprising:

a potential corrector, connected between an upper and lower input voltage terminal, configured to derive an intermediate voltage equal to approximately one-half of an input voltage;

a charge storing unit, operatively connected to the potential corrector, configured to store and suppress variation of the intermediate voltage; and a plurality of voltage regulating circuits, each connected between one of the upper and lower input voltage terminals and the potential corrector, each configured to derive a drive voltage between the intermediate voltage and one of a high or low potential of the input voltage.

10. The voltage generating apparatus of claim 9, wherein the charge storing unit is a capacitor.

11. The voltage generating apparatus of claim 9, wherein at least one of the plurality of voltage regulating circuits is an operational amplifier.

12. The voltage generating apparatus of claim 10, wherein each of the plurality of voltage regulating circuits are operational amplifiers.

13. The voltage generating apparatus of claim 9, wherein the charge storing unit includes a plurality of capacitors.

14. The voltage generating apparatus of claim 9, wherein the potential corrector includes a plurality of resistors arranged to divide the input voltage approximately in half.

15. The voltage generating apparatus of claim 9, wherein the potential corrector includes a voltage-regulating diode that receives the high-potential side voltage and the low-potential side voltage for correcting the intermediate voltage.

16. The voltage generating apparatus of claim 9, wherein each of the plurality of voltage regulating circuits are separated transistor devices.

17. The voltage generating apparatus of claim 9, wherein the potential corrector includes, a voltage divider, configured to divide the input voltage approximately in half to derive the intermediate voltage; and a buffer, including a transistor, configured to ensure that the intermediate voltage is of a low impedance.

18. The voltage generating apparatus of claim 9, wherein the plurality of voltage regulating circuits derive four drive voltages.

19. The display drive voltage generating apparatus of claim 5, wherein the voltage-regulating diode is a zener diode.

20. The voltage generating apparatus of claim 15, wherein the voltage-regulating diode is a zener diode.

* * * * *